United States Patent [19]

Mäkinen et al.

[11] Patent Number: 5,012,208
[45] Date of Patent: Apr. 30, 1991

[54] QUADRATURE MODULATOR HAVING COMPENSATION FOR LOCAL OSCILLATOR LEAK

[75] Inventors: Jarmo Mäkinen, Espoo; Reino Talarmo, Riihimäki, both of Finland

[73] Assignee: Telenokia Oy, Finland

[21] Appl. No.: 506,781

[22] Filed: Apr. 10, 1990

[30] Foreign Application Priority Data

Apr. 11, 1989 [FI] Finland .................................. 891717

[51] Int. Cl.⁵ ............................................ H04L 27/36
[52] U.S. Cl. ................................. 332/103; 332/123; 332/162; 375/39; 375/57; 375/58; 455/63
[58] Field of Search ..................... 332/103–105, 332/107, 123, 159, 162, 167–169; 375/39, 51, 57, 58, 60; 455/46, 63, 109, 126

[56] References Cited

U.S. PATENT DOCUMENTS

| | | | |
|---|---|---|---|
| 3,500,250 | 3/1970 | Frerking | 324/118 |
| 4,105,977 | 8/1978 | Fitting et al. | 455/295 |
| 4,243,955 | 1/1981 | Daniel et al. | 332/167 |

FOREIGN PATENT DOCUMENTS 0265218  4/1988  European Pat. Off. .

*Primary Examiner*—Siefried H. Grimm
*Attorney, Agent, or Firm*—Finnegan, Henderson, Farabow, Garrett & Dunner

[57] ABSTRACT

The invention relates to a quadrature modulator comprising a circuit for the compensation of a local oscillator leak signal in an output signal of the modulator, which circuit adds different compensation voltages to two modulation signals. To provide an automatic compensation of the local oscillator leak signal, the quadrature modulator of the invention comprises a regulating circuit for the regulation of the intensity of the compensation voltages irrespective of each other on the basis of the correlation between the amplitude variation in the output signal and the corresponding modulation signal.

5 Claims, 1 Drawing Sheet

QUADRATURE MODULATOR HAVING COMPENSATION FOR LOCAL OSCILLATOR LEAK

FIELD OF THE INVENTION

The invention relates to quadrature modulators.

BACKGROUND OF THE INVENTION

A quadrature modulator generally signifies an apparatus in which a carrier is orthogonally modulated with two modulation signals. A block diagram of a typical quadrature modulator is presented in FIG. 1. The modulator comprises two mixers 1 and 3, both of them comprising a modulation input, a local oscillator input and a high frequency output. To the mixer 1 is fed a modulation signal I as well as a local oscillator signal LO from a local oscillator signal source not shown. A modulation signal Q is fed to the mixer 3 in a corresponding way, but a local oscillator signal LO is fed to the mixer 3 through a phase shift means 2 in a 90 degree phase shift with respect to the local oscillator signal fed to the mixer 1. The high frequency outputs of the mixers 1 and 3 are connected to an adder element 4 combining the modulated high frequency signals into one high frequency signal to be transmitted forward, which signal is fed to the output OUT of the adder element 4. A typical modulation method carried out by means of a quadrature modulator of this kind is a QPSK modulation.

In a modulator, in which a carrier shall not be transmitted forward, it is difficult to balance the mixers in such a way that the level of an outgoing carrier, i.e. of a local oscillator signal leaked into a modulated high frequency signal, is small enough with respect to an outgoing signal. A local oscillator signal leak is more difficult than before, if the carrier frequency, i.e. the local oscillator frequency, is high and variable. A local oscillator signal leaked into an outgoing signal creates a power peak at the dot frequency, which power peak causes disturbances in other radio apparatuses and even disturbs the reception of the signal at the receiving end. Therefore, the authorities have occasionally given orders concerning the maximum level allowed for a carrier component leaked into a modulated signal. Additionally, a transmission of a carrier means an unnecessary power consumption, because it does not include any information.

The problem with a leaking local oscillator signal has previously been solved by trying to construct the mixers included in the modulator good enough for the frequency range used. In some cases, this can, however, be very difficult and expensive or even impossible. For instance, it depends on the inner balance of the mixers 1 and 3 shown in FIG. 1 how much the local oscillator signal LO leaks to the output of the mixer.

Further efforts have been made to correct this problem by adding direct voltages to the modulation signal I and Q, which voltages provide an outgoing signal with a constant component at the local oscillator frequency. At the manufacturing or mounting stage of the modulator, the direct voltages are set manually in such a way that the outgoing signal component at the local oscillator frequency has the same intensity as the local oscillator leak signal of the modulator, but a reversed phase. These two signals thus cancel each other out.

However, ageing of components, temperature variations and a possible change of the local oscillator frequency generally increase the local oscillator leak when the modulator is working.

SUMMARY OF THE INVENTION

The object of the present invention is to provide an automatic adaptive regulation for a modulator working according to quadrature principle, which regulation eliminates this problem.

This object is achieved by means of a quadrature modulator comprising means for the compensation of a local oscillator leak signal in an output signal of the modulator, which means add different compensation voltages to two modulation signals, and regulating means for the regulation of the intensity of the compensation voltages irrespective of each other on the basis of a correlation between the amplitude variation in the output signal and the corresponding modulation signal.

The invention is based on the observation of the applicant that a local oscillator leak causes variation in the amplitude of a modulated output signal, which variation correlates with modulation signals I and Q. The invention uses this correlation to produce voltages for the compensation of a local oscillator leak.

As long as the modulation signals are present, the solution of the invention attends to that a suitable output signal component, having the same intensity as the local oscillator leak signal of the modulator, but a reversed phase, is produced in the output signal of the modulator to cancel the local oscillator leak. The apparatus works automatically and cancels a local oscillator leak caused for instance by tuning errors of the modulator, thermal drift and frequency changes in the local oscillator signal.

The invention is advantageously realizable and makes it possible to reduce considerably the demands to be made on the mixers and other components of the modulator.

BRIEF DESCRIPTION OF THE DRAWINGS

The invention shall now be described in greater detail by means of embodiments referring to the drawing enclosed, in which.

DETAILED DESCRIPTION OF THE INVENTION

Figure 1:
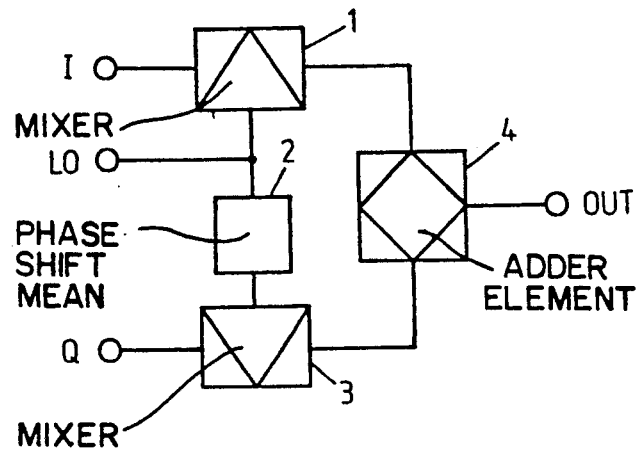
FIG. 1 shows a block diagram of a typical quadrature modulator and FIG. 2 shows a block diagram of a modulator of the invention with an automatic compensation of a local oscillator signal leak.
Figure 2:
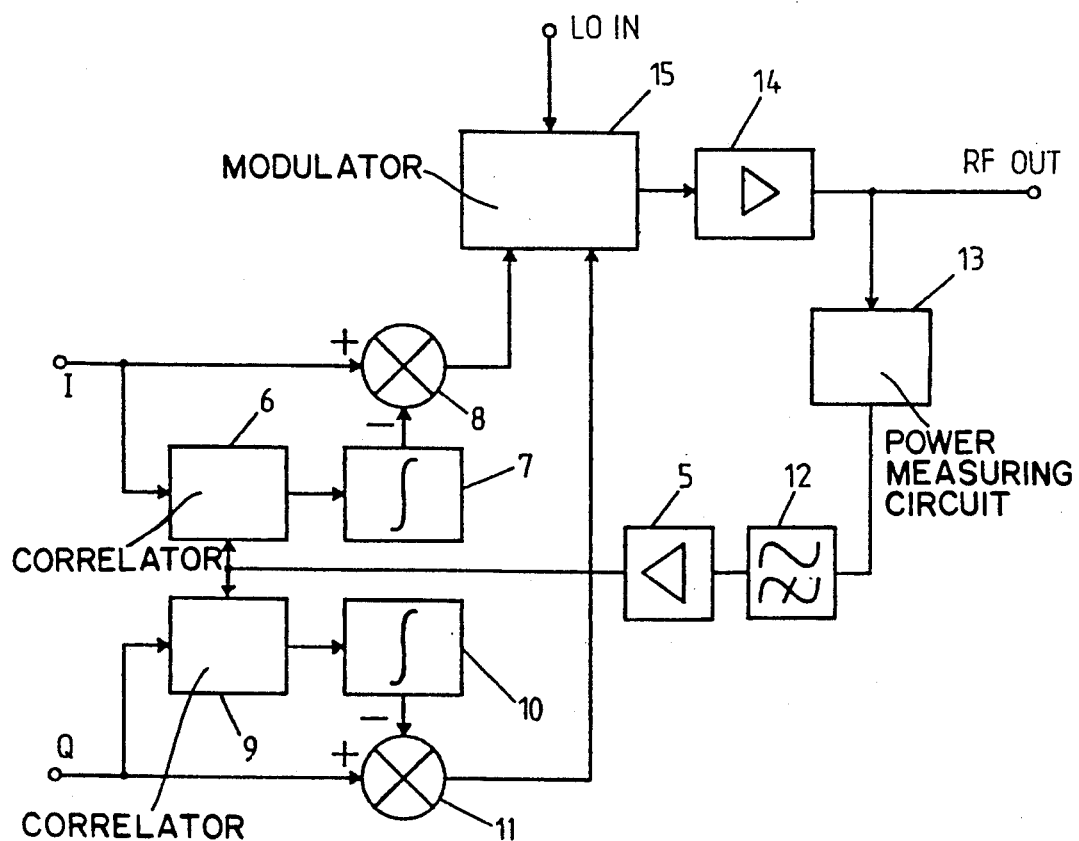

The proper modulator part of the quadrature modulator of FIG. 2 is indicated by the reference numeral 15 and it can for instance be of the type shown in FIG. 1. The modulator part 15 comprises a local oscillator input LO IN and two modulation signal inputs. To the output of the modulator 15 is preferably connected an amplifier 14, by which a modulated output signal is amplified to a power level at which a power measuring circuit 13 connected to the amplifier output works. The power measuring circuit 13 produces a feedback signal, such as a voltage, proportional to the amplitude of the modulated output signal. A direct current component is eliminated from the feedback voltage by means of a high-pass filter 12 connected to the output of the power measuring circuit 13 and an alternating current component of the feedback voltage can preferably be amplified to a suitable level by means of an amplifier 5 connected in series with the high pass filter 12. The amplified signal is fed to one input of a correlator 6 and one input of a correlator 9. A modulation signal I is led to the other input of the correlator 6 and another modulation signal Q is led to the other input of the correlator 9, the correlators comparing the feedback signal with the modulation signals I and Q. The output signal of the correlator 6, i.e. the correlation result, is integrated over time by means of an integrator or low-pass filtered by means of a suitable filter 7 in such a way that quick amplitude variations in the modulated output signal, the variations being irrespective of a local oscillator signal leak, are eliminated from the correlation result. A compensation voltage produced at the output of the integrator or the filter 7 is fed to one input of an adder element 8. To the other input of the adder element 8 is fed a modulation signal I, and then the adder element 8 adds the compensation voltage to the modulation signal I and produces at its output a final modulation signal, which is fed to the modulation input of the modulator 15. Whether adding the compensation voltage to the modulation signal in practice has the effect that the compensation voltage and the modulation signal are summed together or that the compensation voltage is subtracted from the modulation signal depends on the circuit solution and the polarities of the preceding sections in each particular case.

To the output of the correlator 9 again is connected an integrator or a low-pass filter 10 for the elimination of rapid variations from the correlation results. A compensation voltage produced at the output of the filter 10 is connected to one input of an adder element 11. To the other input of the adder element 11 is led a modulation signal Q, whereby the adder element 11 in the manner described above produces another modulation signal to be fed to the modulator 15.

If the feedback signal produced by the power measuring circuit 13, the high-pass filter 12 and an amplifier 5 correlates for instance with the modulation signal Q, the output signal of the modulator 15 includes a local oscillator signal component leaked through the modulator and parallel to the Q-modulation level, and the feedback tries to eliminate this local oscillator signal component automatically by changing the intensity of the compensation voltage fed to the adder 11. The feedback of the branch I works in the same way, if the feedback signal correlates with the modulation signal I. In the quadrature modulator according to the invention, each compensation voltage is thus regulated irrespective of each other on the basis of the correlation between the modulation signal corresponding to each compensation voltage and the feedback signal.

Either amplifier 5 or 14 or both can be eliminated from the circuit solution of FIG. 2, if the outgoing signal of the modulator is so strong that no amplifiers are needed.

The figures and the description relating thereto are only intended to visualize the invention. As to the details, the present invention can vary within the scope of the claims enclosed.

We claim:

1. A quadrature modulator comprising
   means for the compensation of a local oscillator leak signal in an output signal of the modulator, which means add different compensation voltages to two modulation signals, and
   regulating means for the regulation of the intensity of the compensation voltages irrespective of each other on the basis of a correlation between the amplitude variation in the output signal and the corresponding modulation signal.

2. A quadrature modulator according to claim 1, comprising
   a detector means connected to the output of the modulator for the production of a feedback signal proportional to the amplitude variations in the output signal,
   two correlation means, the feedback signal and the first modulation signal being connected to inputs of one correlation means for the production of a first compensation voltage and the feedback signal and the second modulation signal being connected to the inputs of the other correlation means for the production of a second compensation voltage, and
   first and second adder means for adding the first compensation voltage to the first modulation signal and for adding the second compensation voltage to the second modulation signal.

3. A quadrature modulator according to claim 2, wherein the compensation voltages are connected to the adder means through integrating means.

4. A quadrature modulator according to claim 2 or 3, comprising an amplifier before the detector means at the modulator output.

5. A quadrature modulator according to claim 4, wherein a high pass filter and an amplifier are connected in series between the output of the detector means and the inputs of the correlation means.

* * * * *